(12) United States Patent
Standing et al.

(10) Patent No.: US 9,653,370 B2
(45) Date of Patent: May 16, 2017

(54) SYSTEMS AND METHODS FOR EMBEDDING DEVICES IN PRINTED CIRCUIT BOARD STRUCTURES

(71) Applicant: INFINEON TECHNOLOGIES AUSTRIA AG, Villach (AT)

(72) Inventors: Martin Standing, Villach (AT); Andrew Roberts, Wrexham (GB)

(73) Assignee: Infineon Technologies Austria AG, Villach (AT)

( * ) Notice: Subject to any disclaimer, the term of this patent is extended or adjusted under 35 U.S.C. 154(b) by 427 days.

(21) Appl. No.: 13/690,396

(22) Filed: Nov. 30, 2012

(65) Prior Publication Data
US 2014/0153206 A1    Jun. 5, 2014

(51) Int. Cl.
| | | |
|---|---|---|
| H05K 1/14 | (2006.01) | |
| H01L 23/12 | (2006.01) | |
| H05K 3/36 | (2006.01) | |
| H01L 23/538 | (2006.01) | |
| H05K 1/18 | (2006.01) | |
| H05K 3/42 | (2006.01) | |

(52) U.S. Cl.
CPC .......... *H01L 23/12* (2013.01); *H01L 23/5389* (2013.01); *H05K 3/368* (2013.01); *H01L 23/5383* (2013.01); *H01L 2924/0002* (2013.01); *H05K 1/185* (2013.01); *H05K 3/429* (2013.01); *Y10T 29/49126* (2015.01)

(58) Field of Classification Search
CPC ........ H05K 1/182; H05K 1/183; H05K 1/185; H01L 23/5389; H01L 23/12
USPC .................. 361/764, 767, 783, 772–774, 761
See application file for complete search history.

(56) References Cited

U.S. PATENT DOCUMENTS

| | | | | |
|---|---|---|---|---|
| 6,239,976 | B1* | 5/2001 | Templeton et al. ........... | 361/737 |
| 7,417,198 | B2* | 8/2008 | Betz ...................... | H01L 23/047 |
| | | | | 174/536 |
| 7,586,755 | B2* | 9/2009 | Satoh et al. .................. | 361/782 |
| 7,936,567 | B2* | 5/2011 | Takashima et al. .......... | 361/761 |
| 8,072,768 | B2* | 12/2011 | Ockenfuss et al. .......... | 361/761 |
| 8,168,893 | B2* | 5/2012 | Ito et al. ....................... | 174/260 |
| 8,299,599 | B2* | 10/2012 | Nakamura .............. | H01L 29/66 |
| | | | | 257/691 |

(Continued)

FOREIGN PATENT DOCUMENTS

CN    101022703 A    8/2007

OTHER PUBLICATIONS

AT&S, "Research & Development," AT&S PCBs, retrieved from http://www.ats.net/products-technology/research-development/ on Jan. 15, 2015, 2 pp.

(Continued)

*Primary Examiner* — Courtney Smith
*Assistant Examiner* — Christopher L Augustin
(74) *Attorney, Agent, or Firm* — Shumaker & Sieffert, P.A.

(57) ABSTRACT

Embodiments relate to active devices embedded within printed circuit boards (PCBs). In embodiments, the active devices can comprise at least one die, such as a semiconductor die, and coupling elements for mechanically and electrically coupling the active device with one or more layers of the PCB in which the device is embedded. Embodiments thereby provide easy embedding of active devices in PCBs and inexpensive integration with existing PCB technologies and processes.

30 Claims, 11 Drawing Sheets

(56) References Cited

U.S. PATENT DOCUMENTS

| | | | |
|---|---|---|---|
| 8,680,666 B2* | 3/2014 | Hauenstein | H01L 23/3735 257/685 |
| 8,815,647 B2* | 8/2014 | Otremba | H01L 23/142 257/687 |
| 8,829,356 B2* | 9/2014 | Hsu | H01L 23/49822 174/257 |
| 2007/0040186 A1* | 2/2007 | Fillion | H01L 23/4821 257/177 |
| 2007/0161151 A1* | 7/2007 | Madrid | H01L 23/4334 438/106 |
| 2007/0187237 A1 | 8/2007 | San et al. | |
| 2007/0267729 A1* | 11/2007 | Otremba | H01L 23/492 257/678 |
| 2008/0061413 A1* | 3/2008 | Otremba | H01L 21/565 257/676 |
| 2008/0151516 A1* | 6/2008 | Suzuki et al. | 361/761 |
| 2009/0041994 A1* | 2/2009 | Ockenfuss et al. | 428/209 |
| 2009/0188703 A1 | 7/2009 | Ito et al. | |
| 2009/0302461 A1* | 12/2009 | Winter | H01L 23/34 257/713 |
| 2010/0078783 A1* | 4/2010 | Otremba | H01L 23/5389 257/676 |
| 2010/0103634 A1* | 4/2010 | Funaya et al. | 361/761 |
| 2013/0062706 A1* | 3/2013 | Standing | H01L 23/32 257/379 |
| 2013/0146991 A1* | 6/2013 | Otremba | H01L 25/071 257/401 |
| 2014/0111955 A1* | 4/2014 | Standing | 361/761 |

OTHER PUBLICATIONS

Schweizer, "Embedding," Schwizer Electronic, retrieved from http://www.schweizer.ag/en/products-solutions/embedding.html on Jan. 15, 2015, 1 pp.

* cited by examiner

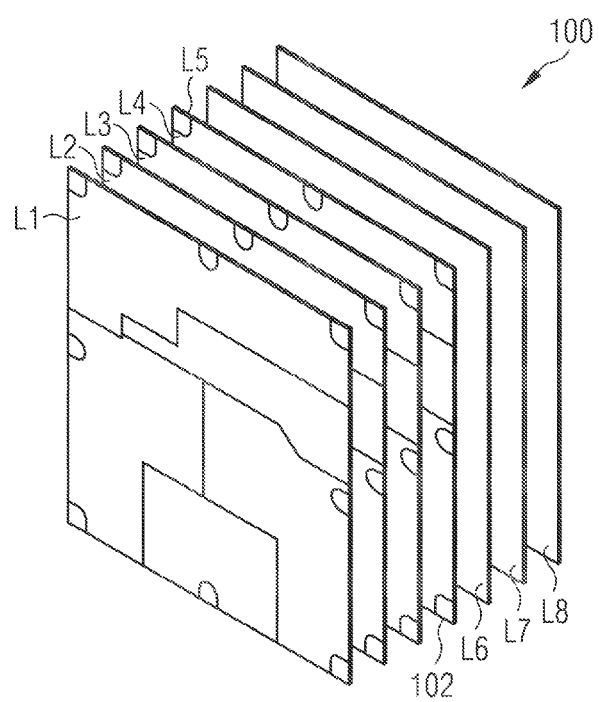

FIG. 3
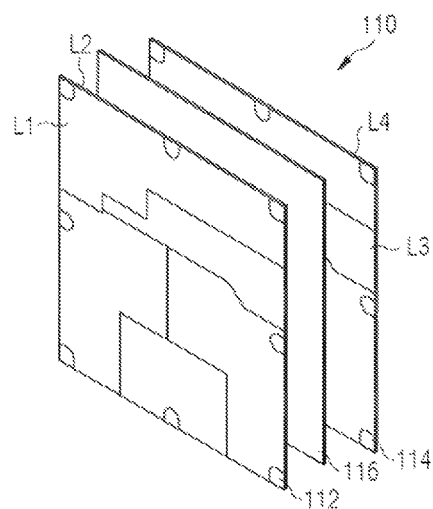
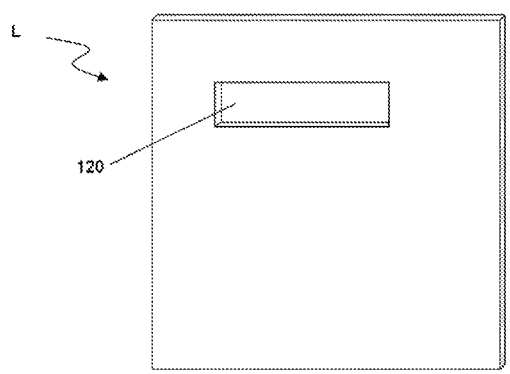
FIG. 4A

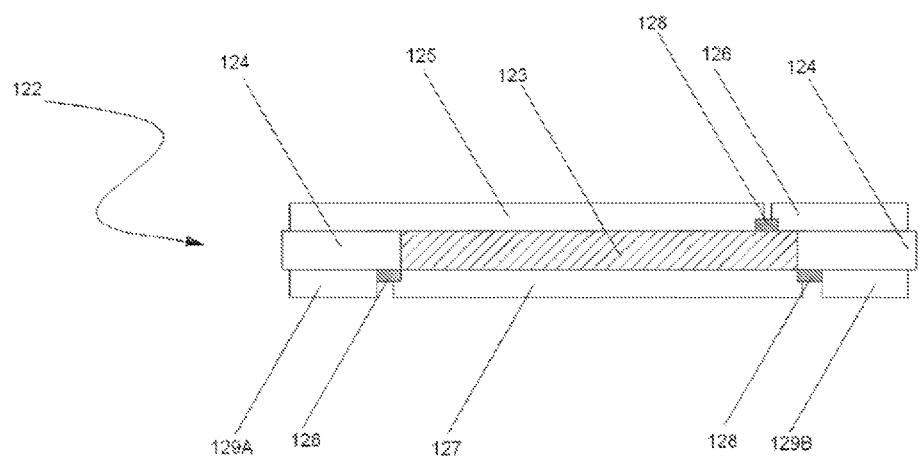
FIG. 5A
FIG. 5B
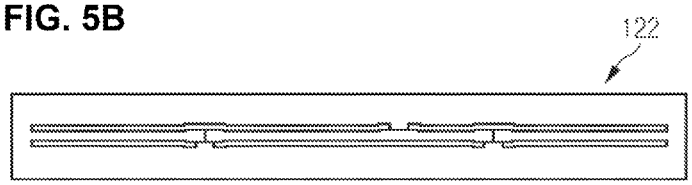

US 9,653,370 B2

SYSTEMS AND METHODS FOR EMBEDDING DEVICES IN PRINTED CIRCUIT BOARD STRUCTURES

TECHNICAL FIELD

The invention relates generally to printed circuit boards (PCBs) and more particularly to embedding devices in PCBs.

BACKGROUND

Conventional approaches to producing and populating printed circuit board (PCB) devices are imperfect. These approaches can be expensive, inefficient and result in products with reduced component densities, parasitic, reliability and robustness.

Several approaches to improving PCB devices have been attempted but still suffer from drawbacks. For example, conventional approaches to embedding chips within PCB boards require expensive laser boring to reach the isolated chip, which can require thick metal layers in order to stop the laser from boring beyond a desired point. Additional drawbacks relate to approaches which include sensitive and complex process steps and techniques that presently make these approaches impractical and costly.

SUMMARY

Embodiments relate to printed circuit boards (PCBs), such as multi-layer PCBs, comprising embedded active devices.

In an embodiment, an insert configured to be embedded in a multi-layer printed circuit board (PCB) that comprises a first layer, a second layer that includes an aperture, and at least a third layer arranged above the second layer, comprises a semiconductor die arranged at a surface of the insert, wherein the semiconductor die includes at least one pad that is configured to be electrically coupled with to create an electrical connection to at least one circuit of the semiconductor die from external to the semiconductor die; and at least one extender portion that extends a distance along the surface of the insert from the pad to a coupling element with a surface area substantially greater than a surface area of the at least one pad of the semiconductor die, and wherein the coupling element is configured to be electrically coupled with from external to the second layer through an opening in one or more of the first layer and the third layer.

In an embodiment, a printed circuit board (PCB) comprises a first layer; a second layer that includes an aperture, wherein the aperture is sized, shaped, and arranged to receive an insert that is configured to be disposed in the aperture in the second layer, wherein the insert comprises a semiconductor die arranged at a surface of the insert, wherein the semiconductor die includes at least one pad that is configured to be electrically coupled with to create an electrical connection to at least one circuit of the semiconductor die from external to the semiconductor die, and at least one extender portion that extends a distance spaced apart along the surface of the insert from the pad to a coupling element with a surface area substantially greater than a surface area of the at least one pad of the semiconductor die; and wherein the PCB further comprises at least one third layer arranged upon the second layer to substantially enclose the semiconductor die within the aperture; and wherein the coupling element is configured to be electrically coupled to from external to the second layer through an opening formed in one or more of the first layer and the third layer.

In an embodiment, a printed circuit board (PCB) comprises a plurality of layers coupled to form a stack, wherein at least one layer of the plurality of layers comprises an aperture; an insert comprising a die and at least one coupling element spaced apart from the die, the insert configured to be disposed in the aperture; and at least one via formed through the plurality of layers and the at least one coupling element to electrically couple the insert with at least one of the plurality of layers other than the at least one layer comprising the aperture.

In an embodiment, a method of forming a printed circuit board (PCB) stack comprises forming an insert comprising a semiconductor die arranged at a surface of the insert, wherein the semiconductor die includes at least one pad that is configured to be electrically coupled with to create an electrical connection to at least one circuit of the semiconductor die from external to the semiconductor die, and at least one extender portion that extends a distance along the surface of the insert from the pad to a coupling element with a surface area substantially greater than a surface area of the at least one pad of the semiconductor die; forming a first layer comprising an aperture; arranging the insert in the aperture; arranging at least one additional layer with the first layer to form a stack; and electrically coupling with the coupling element of the insert from external to the first layer of the stack through an opening in one or more of the at least one additional layers.

BRIEF DESCRIPTION OF THE DRAWINGS

The invention may be more completely understood in consideration of the following detailed description of various embodiments of the invention in connection with the accompanying drawings, in which:

FIG. 1 is a perspective view of a printed circuit board (PCB) layer stack according to an embodiment.

FIG. 3 is a perspective view of a PCB layer stack according to an embodiment.

FIG. 4A is a perspective view of a PCB layer comprising an aperture according to an embodiment.

FIG. 5A is a side cross-sectional view of an active insert according to an embodiment.

FIG. 5B is a side cross-sectional view of a built-up version of the insert of FIG. 5A according to an embodiment.

Figure 2A:
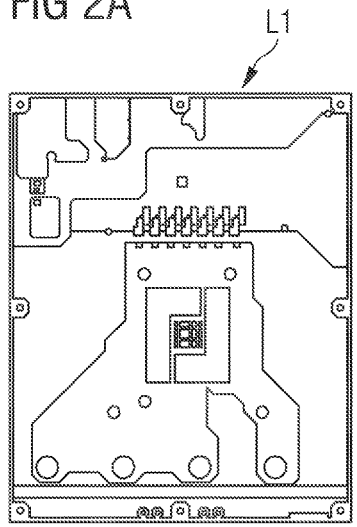
FIG. 2A is top view of a first PCB layer according to an embodiment.
Figure 2B:
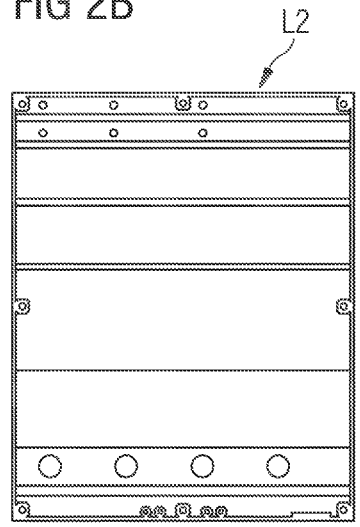
FIG. 2B is top view of a second PCB layer according to an embodiment.
Figure 2C:
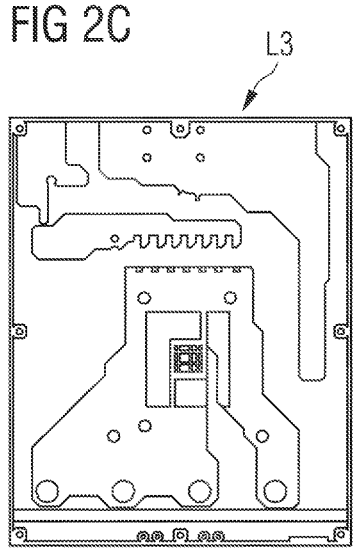
FIG. 2C is top view of a third PCB layer according to an embodiment.
Figure 2D:
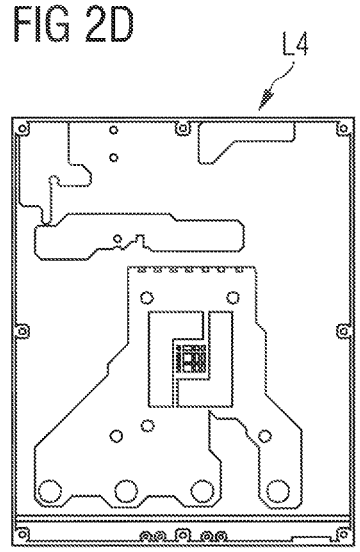
FIG. 2D is top view of a fourth PCB layer according to an embodiment.
Figure 2E:
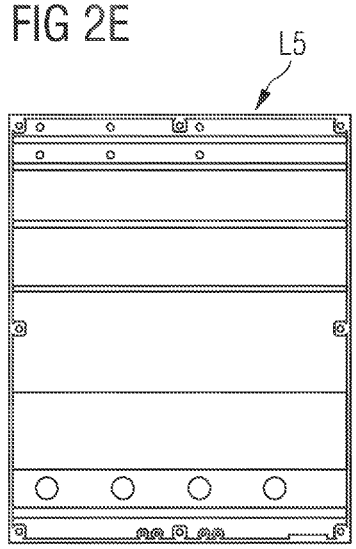
FIG. 2E is top view of a fifth PCB layer according to an embodiment.
Figure 2F:
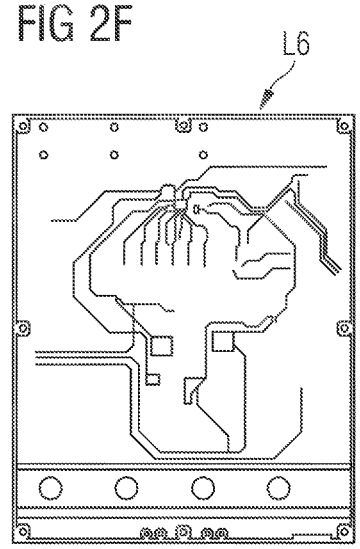
FIG. 2F is top view of a sixth PCB layer according to an embodiment.
Figure 2G:
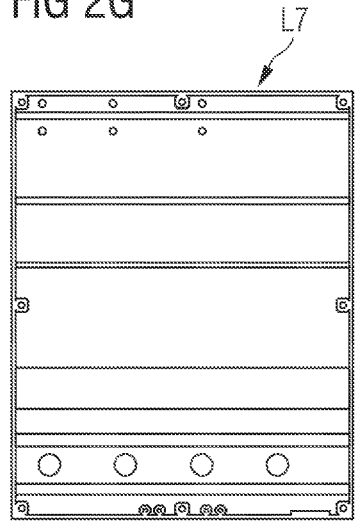
FIG. 2G is top view of a seventh PCB layer according to an embodiment.
Figure 2H:
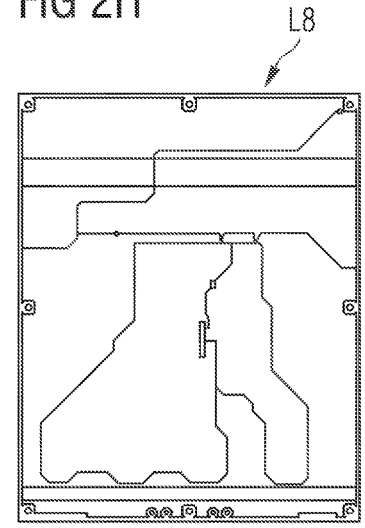
FIG. 2H is top view of a eighth PCB layer according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to active devices embedded within printed circuit boards (PCBs). In embodiments, the active devices can comprise at least one die, such as a semiconductor die, and coupling elements for mechanically and electrically coupling the active device with one or more layers of the PCB in which the device is embedded. Embodiments thereby provide easy embedding of active devices in PCBs and inexpensive integration with existing PCB technologies and processes.

In embodiments, the die of the active insert can comprise one or more circuits, circuit elements, integrated circuits, or semiconductor devices, such as power semiconductor devices, surface mount devices, transistors including insulated gate bipolar transistors (IGBT), field effect transistors (PETs), metal-oxide-semiconductor PETs (MOSFETs), diodes, or other devices. The coupling elements are configured to provide convenient coupling with one or more layers of the PCB by being coupled to but spaced apart from the die, reducing the need for accuracy when forming vias in the PCB.

The PCB can be a multi-layer structure in embodiments, with the embedded active insert configured to be positioned within or among the layers in an aperture formed in at least one of the layers. So positioned, the embedded active insert can be electrically coupled with at least one other layer or component of the PCB. The embedded insert also can be single-layer or multi-layer and can have the same or a different number of layers than the PCB or the portion of the PCB in which the insert is embedded. These and other features provide for easy embedding of active inserts within PCBs, without the need to customize conventional PCB process flows.

PCBs typically are single- or multi-layer structures configured to structurally support and electrically couple various electronic components. The structural support is provided by one or more substrate layers, which typically are non-conductive. In embodiments, multi-layer PCBs can be formed having a central core comprising a dielectric or other material. For example, the central core can comprise FR-4, which is a woven glass and epoxy structure, or some other suitable structure or material in embodiments. The core can be copper-laminated on both sides, comprising a copper-clad laminate core or other structure. The layers coupled or laminated to the core can comprise single-sided copper-laminated pre-impregnated (or "pre-preg") structures, such as a fiber weave structure impregnated with a resin bonding agent. Other core and layer materials and structures can be used in other embodiments as appreciated by those having skill in the art, with the embodiments depicted and discussed herein being used by way of example only.

Electrical coupling between and among layers as well as components and devices populating a surface of a PCB is provided by conductive traces or pathways formed on the substrate layers, such as from patterning or etching copper foil or sheets laminated on the layers or using other subtractive or additive processes. Additional dielectric, insulating and other layers also can be provided. Through-holes, vias, bond wires, contacts and other electrical coupling structures can be formed in or on the PCB to couple electrical components to the PCB and/or to one another, to couple the components or the PCB itself to an external device or structure, and to make electrical connections between and among PCB layers and other components. Vias, for example, refer to vertical interconnect access and can be formed in one or more layers of a PCB to facilitate electrical coupling between layers, components or elements. For example, a through-via can connect a surface-mounted component on the PCB with a contact area formed on a layer within the PCB, or a through-via can bring a ground or other signal from a first layer of a PCB to one or more other layers. Bond wires can couple circuits and elements on a surface of the PCB with other circuits or elements, including PCB traces. Other coupling structures, components and configurations suitable for use with PCBs will be appreciated by those skilled in the art.

An example exploded PCB layer stack 100 is depicted in FIG. 1. Stack 100 is an eight-layer stack comprising layers L1, L2, L3, L4, L5, L6, L7 and L8, with layers L4 and L5 being formed on a central double-sided copper clad core 102 in this embodiment. An example embodiment of each of layers L1-L8 is depicted in FIGS. 2A-2H. Each subsequent layer is formed on a single-sided copper laminated pre-preg, which is laminated to each side (i.e., L3 to L4, L2 to L3, L1 to L2 and L6 to L5, L7 to L6 and L8 to L7) of core 102, thereby effectively forming another double-sided board each time a new layer is added to stack 100. The copper of each layer L1-L8 can be pre-etched or otherwise pre-processed, or etched after the layer has been added to the stack, in embodiments. Moreover, different processes and steps can be used for different layers in embodiments. Processes other than etching, such as additive processes, also can be used in embodiments.

Other stack structures also can be used. For example, a pre-preg layer can be placed at the center, with multi-layer cores or other pre-preg layers built around it to form a stack. In FIG. 3, a stack 110 is depicted in which layers L1 and L2 comprise a double-sided laminate structure 112, and layers L3 and L4 comprise another double-sided laminate structure 114. The two structures 112 and 114 then can be laminated together with a pre-preg layer 116, for example, or some other structure or process. In this embodiment, both copper sides of each double-sided laminate structure 112 and 114 have been pre-processed, but this can vary in other embodiments. Additional layers can be added to stack 110, and those layers can be pre-processed or not, and can be double-sided or not, in embodiments.

In embodiments, one or more of the layers of a PCB stack, such as any of layers L1-L8 of stack 100 or layers L1-L4 of stack 110, comprises an aperture, well or other opening configured to receive an active insert to be embedded within stack 100. Referring to FIG. 4A, a layer L comprises an aperture 120. Layer L can comprise pre-preg, a dual-sided core or some other layer structure in embodiments. For example, in one embodiment, layer L comprises a plurality of layers, while in another embodiment layer L comprises a single layer. The size, configuration and position of aperture 120 can vary in embodiments. In general, aperture 120 can be sized and configured during the design and layout of layer L as part of a PCB stack according to an active insert which will be arranged in aperture 120. As such, the design and layout can take into consideration the insert and its functionality relative to the overall PCB stack in embodiments to select the location of aperture 120 and the interconnections with and arrangement of the insert relative to other elements of the stack. Taking this into account during the design and layout process enables the active insert arranged in the aperture 120 to be easily mechanically and electrically coupled with one or more layers of the stack, or elements on the layers, by a via, trace, circuit, component or other electrical element 124, as will be discussed herein below in more detail.

The position of aperture 120 typically will depend upon the overall design, layout and function of the PCB stack into which layer L will be incorporated. For example, aperture 120 can be arranged at or near the center, an edge or at some other location on layer L such that interconnects between an active insert to be embedded therein and one or more adjacent layers can be facilitated. In another embodiment, aperture 120 can be arranged such that the active insert to be embedded therein will be at least partially accessible from a surface of the PCB. In yet another embodiment, aperture 120 can be arranged such that the active insert therein can utilize other portions of the PCB layer stack as a heat sink or for some other purpose. Those skilled in the art will recognize that the particular configuration of aperture 120 within layer L and relative to any additional layers can vary in embodiments according to these and other factors.

Figure 4B:
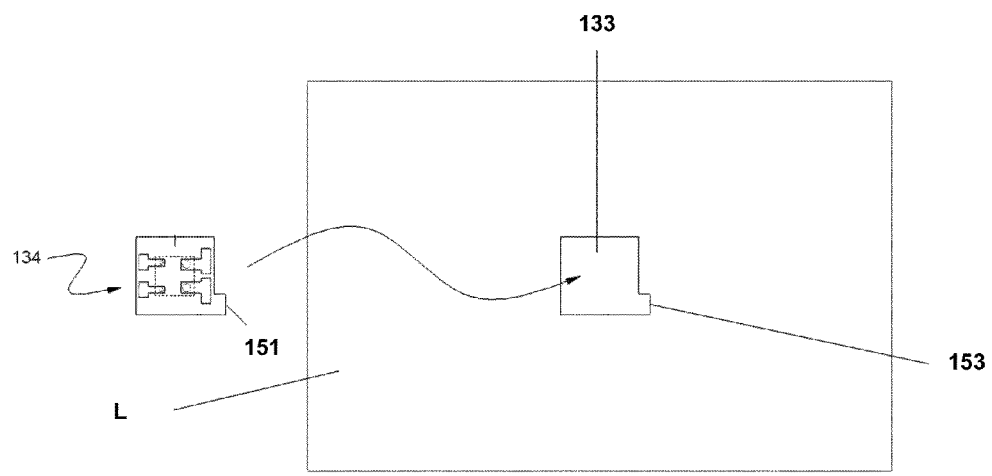
FIG. 4B is a conceptual diagram of a PCB layer comprising an aperture and an insert according to an embodiment.
Figure 4C:
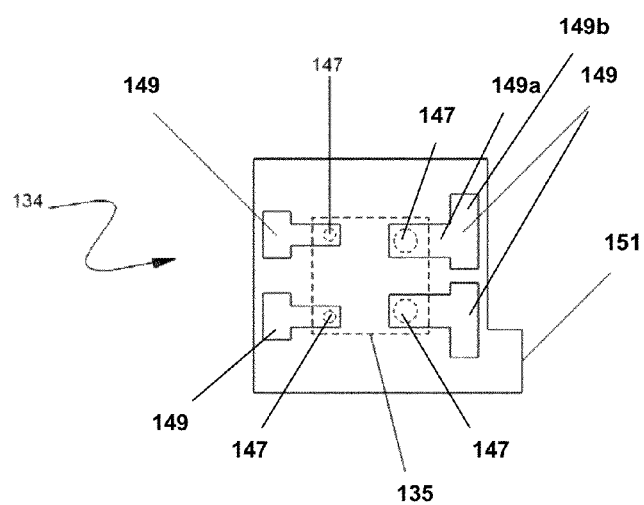
FIG. 4C is a conceptual diagram of the insert of FIG. 4B.

FIG. 4B is a conceptual diagram that depicts an embodiment of an insert 134 configured to be arranged in an aperture 133 in a PCB layer L. As shown in FIG. 4C, insert 134 includes a semiconductor die 135 arranged at a surface of insert 134. Semiconductor die 135 can include one or more electrical circuits that perform various functions. For example, semiconductor die 135 can include one or more hardware circuits (e.g., Application Specific Integrated Circuits, or ASICs), programmable circuits (e.g., a field programmable gate array), or processor circuits configured to execute instructions to perform functions. As also depicted in FIG. 4C, semiconductor die 135 can include one or more coupling elements 147, which also can be referred to as pads 147 of semiconductor die 135.

It can be beneficial to couple semiconductor die 135 to one or more other circuits or devices external to semiconductor die 135. For example, when insert 134 is arranged within aperture 133 in PCB layer L as described above, it can be beneficial to electrically couple circuits or devices arranged in another layer of the PCB stack, arranged on an exterior surface of the PCB, or arranged external to the PCB, to circuits of die 135.

According to an example, it can be difficult, time-consuming, or expensive to couple to a die that is embedded within a layer of a PCB. For example, because pads or other coupling areas of such a die can have a small surface area with which to connect, it can be difficult to locate and/or connect to pads or other coupling areas from external to a PCB and/or external to a layer in which the die is embedded. For example, drilling into layers of a PCB to reach such an embedded die can require relatively expensive, complex, and/or difficult techniques such as laser drilling techniques. It may not be practical to use simpler techniques such as mechanical boring processes.

According to embodiments, insert 134 includes one or more extender portions 149*a* and one or more coupling elements 149*b* coupled to pads 147. Each extender portion 149*a* is electrically coupled to a corresponding pad 147 of die 135 and extends a distance along a surface of insert 134 to a coupling element 149*b*. Extender portions 149*a* and coupling elements 149*b* have a surface area substantially greater than a surface area of pads 147, which can enable the use of simpler techniques to reach pads 147 for electrical coupling, such as mechanical boring techniques, by providing a larger contactable area than pads 147 can provide alone. For example, a surface area of coupling element 149*b* can be a factor of 10 times greater than a surface area of pad 147. As one example, pad 147 can have a surface area in the range of about 50 microns to about 200 microns, while coupling element 149*b* can have a surface area between about 500 microns to about 2,000 microns, in embodiments.

Both extender portions 149*a* and coupling elements 149*b* can have a variety of shapes and configurations in embodiments. In FIGS. 4B and 4C, extender portions 149*a* generally extend in an x-direction relative to a width of the page on which the drawing is arranged while coupling elements 149*b* generally extend in a y-direction relative to a length of the page. In other embodiments, extender portions 149*a* and coupling elements 149*b* can comprise a single portion extending in one direction, such as a single rectangular structure extending away from pad 147, or they can comprise a single larger area around or extending from contact elements 147 (e.g., a large square with contact element 147 arranged in a corner, along an edge, or in some other manner), be rounded, or have virtually any size, shape and configuration which can enable the use of simpler techniques to reach coupling elements 147. In still other embodiments, the arrangements of different extender portions 149*a* and coupling elements 149*b* are not identical, as they are depicted in FIGS. 4B and 4C; refer, for example, to FIG. 6D herein below.

In addition, the distance that extender portion 149, such as by first portion 149*a* as depicted in FIG. 4C, extends from a coupling element 147 can be selected to improve an ability to couple with circuitry internal to die 135. For example, extender portion 149*a* can have a distance selected such that die 135 will not be damaged when using simpler coupling techniques, such as mechanical boring, to reach die 135. For example, extender portion 149*a* can have a distance that is substantially greater than a diameter of a mechanical drill bit that can be used to drill through layers of a PCB that includes insert 134, so that drilling to insert 134 will not damage die 135.

As also shown according to the embodiment of FIGS. 4B and 4C, insert 134 comprises one or more alignment portions 151 that enable insert 135 to self-align with one or more corresponding alignment portions 153 of aperture 133. For example, FIGS. 4B and 4C depict one example in which insert 134 includes a male alignment portion 151 configured to self-align with a corresponding female alignment portion 153 of aperture 133. In other embodiments, the configuration, placement, size and other features of alignment portions 151 and 153 can vary. For example, the male/female relationship can be reversed, a plurality of alignment portions can be included on any one insert/aperture arrangement, or the alignment portions can be configured in some other suitable manner enabling self-alignment of insert 134 in aperture 133.

Referring to FIG. 5A, an embodiment of an active insert 122 is depicted. Insert 122 can comprise a die, such as a semiconductor die, having one or more active circuits or circuit elements, such as one or more transistors, diodes, integrated circuits, circuit elements, power semiconductor devices or other functional circuitry. The structure and configuration of insert 122 will vary according to the function and purpose of the element, circuitry and other components of any particular insert 122, such that the examples discussed and depicted herein are not be considered limiting. In FIG. 5A, for example, insert comprises a die 123 and a core 124, such as FR4, around which are formed copper traces or layers comprising a source 125, gate 126 and drain 127. Dielectric layers 128 are arranged, for example, between source 125 and gate 126, as well as between die 123 and core 124 in this embodiment.

Insert 122 is configured such that large coupling elements 129A and 129B for electrically coupling insert 122 with one or more other portions of the PCB stack in which insert 122 will be embedded are formed. Coupling elements 129A, 129B can comprise conductive coupling structures and generally extend outwardly from the portion of insert 122 comprising die 123, in particular one or more pads of die 123 as discussed with reference to FIGS. 4B and 4C, such that they are spaced apart therefrom, with copper layers, here of gate 126 and source 125, to couple coupling elements 129A, 129B with die 123. Arranged in this manner, the area of die 123 can be avoided and remain unaffected when coupling insert 122 with the PCB stack, such as by mechanically drilling plated through-hole vias in the stack and through coupling elements 129A, 129B, making insert 122 more robust and convenient to handle while also minimizing the potential for misalignment in coupling due to the relatively large size of coupling elements 129A, 129B as compared with pads of die 123. In embodiments, coupling elements 129A, 129B can be arranged sized such that misalignment, drill wander or coupling errors are reduced or eliminated, enabling drilling of one or more PCB stacks to form vias coupling with insert 122 according to typical processes. Thus, in embodiments, coupling elements 129A, 129B are generally large, and can be larger in embodiments than typical pads or other contacts, such as discussed above with reference to FIGS. 4B and 4C. Drilling in the near vicinity of die 123 itself is therefore generally avoided in embodiments to prevent damage thereto or interference therewith. The embedding within and coupling of insert 122 with the PCB stack will be discussed in more detail below.

Referring also to FIG. 5B, the thickness of insert 122 can vary significantly in embodiments, depending upon the components and functionality of the elements or circuitry of insert 122. Thus, the thickness of insert 122 could be very thin, such as about 100 µm to about 200 µm in the embodiment of FIG. 5A, such that it is thinner than the layer in which it is to be embedded in the PCB stack. In embodiments, insert 122 can be built-up or thickened by adding additional layers or material, such as pre-preg, until a thickness of insert 122 matches the core, pre-preg or other layer into which it will be embedded. In FIG. 5B, then, insert 122 has been thickened by adding pre-preg to either side of that which is depicted before being thickened in FIG. 5B. In embodiments, thickening can be omitted, or the thickening on one or both sides of insert 122 can vary, again according to a thickness suitable for embedding in one or more layers of a PCB stack. In these and other embodiments, pre-preg, dielectric and other layers can be added for thickening and/or to provide isolation to prevent shorting or other undesired interactions between insert 122 and other elements of the PCB stack. The pre-packaged nature of insert 134 provides for the design, layout, formation and testing of insert 134 before embedding within stack 130.

Figure 5C:
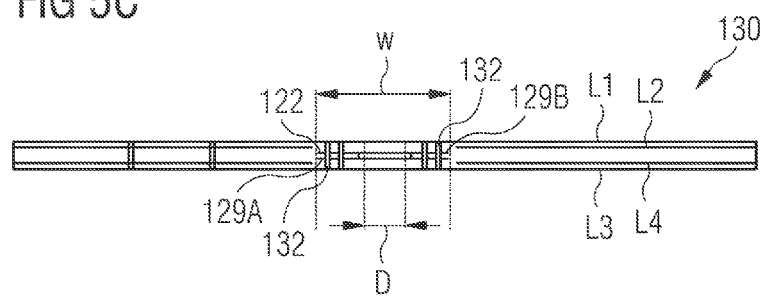
FIG. 5C is a side cross-sectional view of the insert of FIG. 5B embedded in a PCB stack according to an embodiment.
Figure 5D:
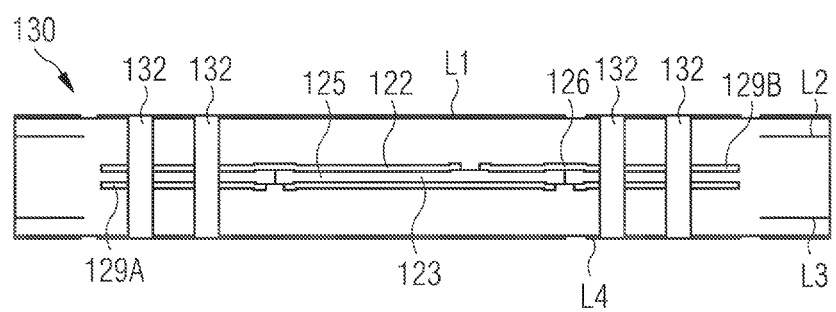
FIG. 5D is a detail view of FIG. 5C according to an embodiment.

Referring to FIG. 5C, thickened insert 122 of FIG. 5B is depicted embedded within a four-layer PCB stack. The width of insert 122 within stack 130 is illustrated at W, with the area of die 123 shown at D. In embodiments, the area of die 123 illustrated at D is kept free of components, vias, drilling and other activity in order to avoid any damage to or interference with insert 122 embedded in stack 130. Coupling elements 129A and 129B, however, form easy targets for vias 132 to mechanically and electrically couple insert 122 with one or more layers of PCB stack 130. In the embodiment of FIG. 5C, vias 132 comprise plated throughwhole vias, but other via and coupling structures can be used in other embodiments. Vias 132 physically and electrically couple coupling elements 129A, 129B with one or more layers of stack 130, such that signals from one or more nodes or portions of active devices of insert 122 can be brought to a surface of stack 130. In other embodiments, supply, ground or other signals can be brought from another layer of stack 130 to one or more nodes or portions of one or more active devices of insert 122. In the embodiment of FIG. 5C, signals from the source 125 and gate 126 are brought to a top layer L1 and a bottom layer L4 of stack 130, as can be seen in more detail in FIG. 5D. In embodiments, isolation pads can be used at one or more layers, such as at layer L4, if a signal is not needed there. Similar coupling arrangements can be used for drain 127 as well as other circuit portions and elements, including supply and ground signals, though these coupling arrangements are not visible in the cross-sectional views of FIG. 5. For example, additional coupling elements 129 can extend from insert 122 perpendicular or otherwise with respect to those depicted in FIG. 5 in order to provide additional couplings.

Other configurations can be used in other embodiments, as appreciated by those skilled in the art. For example, in embodiments vias 132 can electrically couple insert 122 to at least one layer other than the layer in which insert 122 is embedded, wherein insert 122 also can be electrically coupled to the layer in which it is embedded or not, depending upon the design, layout and functionality of insert 122 and the overall PCB stack.

Figure 6A:
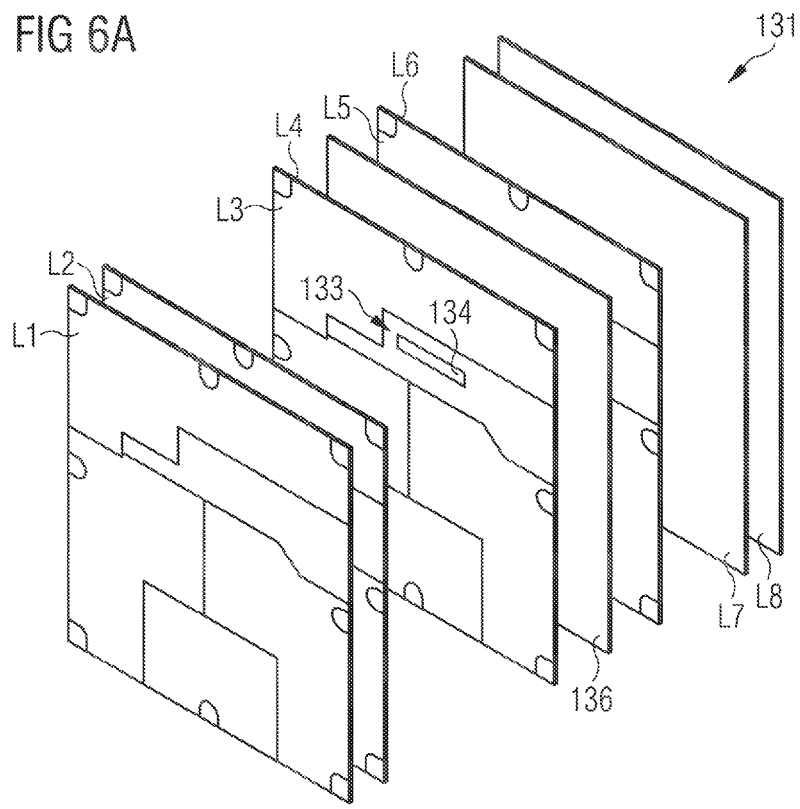
FIG. 6A is a perspective view of a PCB layer stack comprising an embedded active insert according to an embodiment.

Referring to FIG. 6A, a PCB layer stack 131 is depicted with layers L1-L8 exploded. An aperture 133 in a layer L3/L4 comprises an active insert 134, such that insert 134 is embedded within stack 130. Layers L3 and L4 comprise a double-sided core laminate structure, similar to layers L1 and L2, and layers L3 and L4, in FIG. 3. Layers L5 and L6 also comprise a double-sided core laminate structure, and a pre-preg layer 136 is laminated between layers L4 and L5 in an embodiment. Layers L1, L2, L7 and L8 comprise single-sided copper layers in an embodiment, laminated together with layers L3, L4, L5 and L6 to form stack 131. The particular configuration of stack 130 and its layers L1-L8 is merely exemplary of one embodiment and is not be considered limiting with respect to other embodiments. Aperture 133 can be arranged within stack 131 such that insert 134 can be coupled to vias and other components arranged in and/or on stack 131, as discussed herein.

Figure 6B:
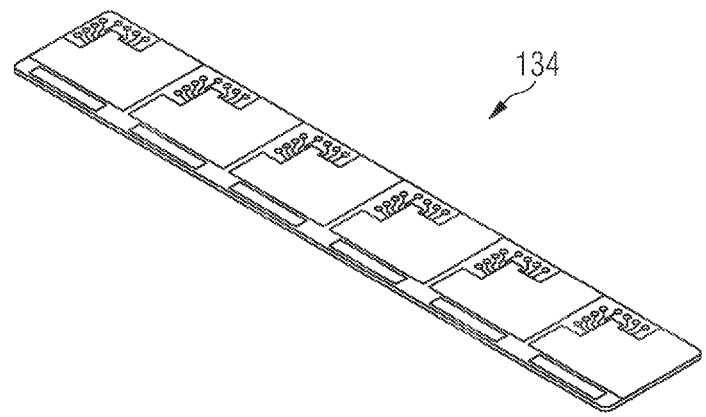
FIG. 6B is a top perspective view of an active insert for embedding within a PCB layer stack according to an embodiment.
Figure 6C:
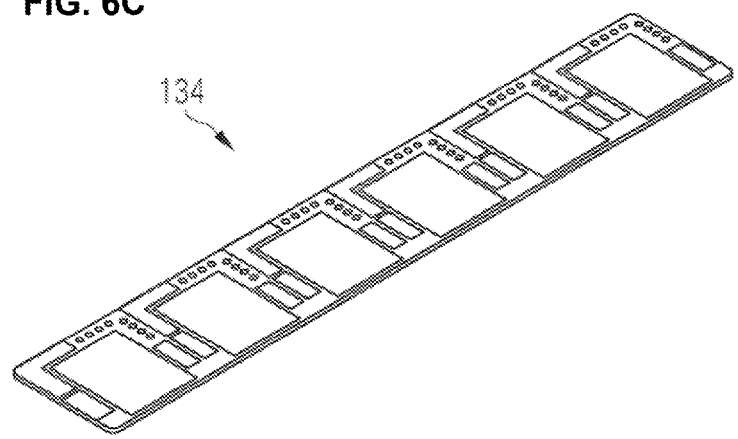
FIG. 6C is a bottom perspective view of the active insert of FIG. 6B.
Figure 6D:
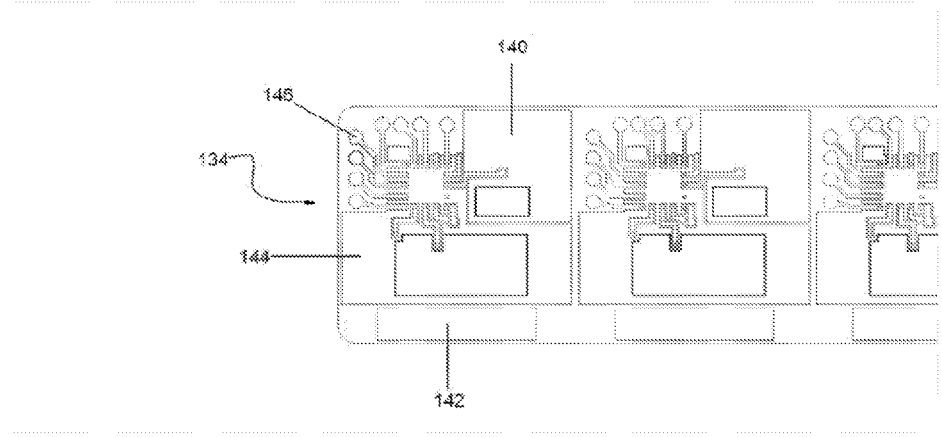
FIG. 6D is an enlarged partial top view of the active insert of FIG. 6B.

Referring also to FIGS. 6B, 6C and 6D, insert 134 comprises a synchronous buck converter in a six-phase layout. While insert 134 as depicted omits the control integrated circuit (IC) in the embodiment depicted, this IC and other circuitry and components can be included in insert 134 in other embodiments.

Prior to being embedded in stack 131, the synchronous buck converter and other elements of insert 134, as for insert 122 previously discussed, can be tested and the tested insert 134 provided to a PCB manufacturer as a component which can be handled and treated as another PCB stack component, with the difference that insert 134 is a stack component for embedding within stack 131 as opposed to a surface mount component, for example. With the exception of embedding insert 134 at an appropriate process point in aperture 132 in a layer L3/L4, the PCB stack formation process will otherwise need no customization or specialization, providing a significant advantage in the industry. In particular, with the design and layout of the stack taking insert 134 into consideration in its overall design, as well as the design of insert 134 itself facilitating easy coupling with stack 131, there is no need to use lasers, mechanical boring or other conventional approaches to reaching and coupling with embedded portions of a PCB stack.

FIG. 6B depicts a top view of insert 134, FIG. 6C a bottom view and FIG. 6D a partial detail view. Each phase of insert 134 comprises Vin 140, Vout 142, ground 144 and IC 146 coupling elements for coupling to vias and other circuitry components within stack 131, similar to coupling elements 129 discussed with reference to FIG. 5. In embodiments, one or more of Vin 140, Vout 142, ground 144 and IC 146 coupling elements directly electrically couple with a component, such as a plated through-via, in order to physically and electrically couple insert 134 with another layer of stack 131. In one embodiment, one or more portions of insert 134 directly electrically couple with a via or other coupling element in order to be coupled to or more other layers of stack 131. For example, plated through-hole vias can be used in embodiments to couple insert 134 with one or more layers of stack 131 in order to extract electrical signals from, or communicate electrical signals to, insert 134. Thus, in embodiments, layers of stack 131, including those immediately adjacent layer layers L3 and L4, can comprise vias, pads, traces, or other interconnection structures to allow for easy coupling with embedded insert 134 by plated through-hole vias or other suitable electrical coupling structures. In another embodiment, apertures filled with a conducting material can be used instead of or in addition to plated through-hole vias. For example, in one embodiment an aperture is filled with a silver epoxy material or other conductive material and used instead of a via.

The particular vias, pads and other interconnection structures on each of insert 134 and layers within stack 131 can vary according to the overall design and layout of stack 131, the functionality and purpose of stack 131 and insert 134, and other factors as appreciated by those skilled in the art. For example, vias or other interconnects suitable for high currents can be selected in embodiments. In general, however, large coupling elements formed on insert 134 spaced apart from the die of insert 134, in particular the pads of the die, and other convenient coupling and interconnecting structures can be used in embodiments to facilitate easy integration and coupling of insert 134 and reduce the need for precise accuracy in aligning coupling elements between insert 134 and other layers of the stack. Moreover, the inserts depicted and described herein are but examples of inserts suitable for embedding within a PCB stack, just as the particular example arrangements of stacks herein are exemplary.

Figure 7A:
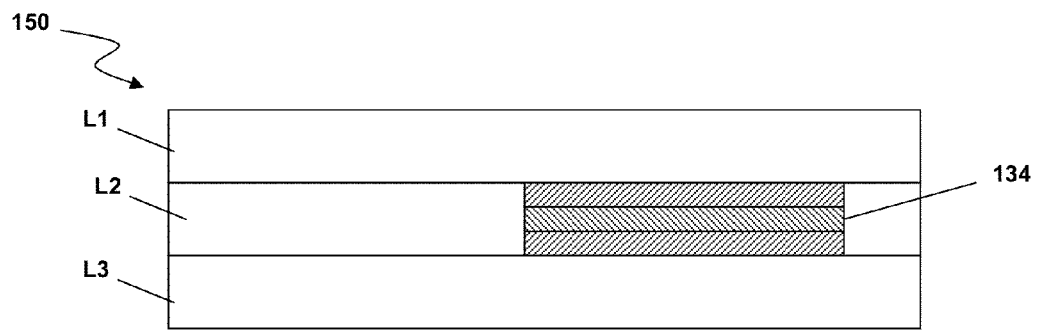
FIG. 7A is a side cross-sectional view of a PCB layer stack comprising a multi-layer embedded insert according to an embodiment.
Figure 7B:
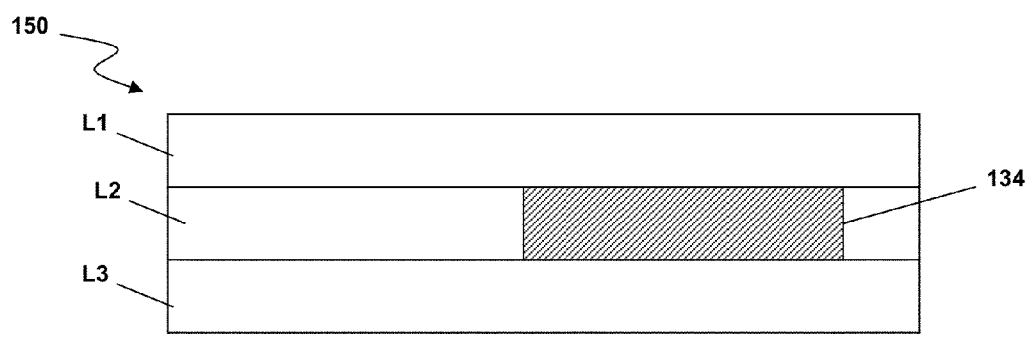
FIG. 7B is a side cross-sectional view of a PCB layer stack comprising a single-layer embedded insert according to an embodiment.
Figure 7C:
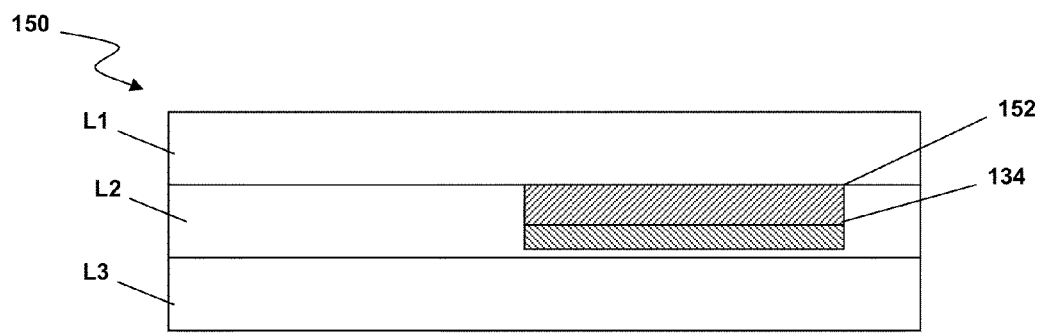
FIG. 7C is a side cross-sectional view of a PCB layer stack comprising a multi-layer embedded insert according to an embodiment.

In embodiments, insert 134 can be designed for embedding within stack 131 to maximize the cooling potential of the layers of stack 131 with more copper mass, such as the ground planes. In other embodiments, however, insert 134 can be arranged such that it is exposed on a top or bottom layer, is positioned at or proximate to an edge of stack 131, or has some other arrangement. Additionally, insert 134 can have the same or a different number of layers than the layer or layers in which it is embedded. For example, insert 134 can comprise a plurality of layers and be embedded within a single layer L2 of a stack 150 in an embodiment, as depicted in the cross-sectional view of FIG. 7A, or insert 134 can comprise a single layer embedded within a single layer in another embodiment depicted in cross-section in FIG. 7B, or some other arrangement in still other embodiments. In FIG. 7C, insert 134 is embedded within stack 150 in a well 152 formed in layer L2. In another embodiment, a corresponding well could be formed in layer L1, such that insert 134 is partially embedded in each. Many other embedded approaches and designs can be used in other embodiments. In other words, a great deal of flexibility can be provided by insert 134 within the overall design and layout of stack 130.

Numerous advantages are provided by embodiments of embedded inserts in PCB stacks as discussed herein. First, area requirements can be reduced. In the above-discussed example related to a synchronous buck converter in a six-phase layout, a conventional surface mount component requires an area of approximately 750 mm$^2$, whereas an insert similar to that depicted in FIG. 6 occupies only about 240 mm$^2$. Second, parasitic losses can be reduced, often significantly, in embodiments due to improved layout options offered by embedded active inserts within PCB stacks. High loss device or component interfaces also can be reduced. Additionally, PCB component density can be increased and thermal characteristics improved, through the embedding of the insert itself within the stack as well as the ability to solder or otherwise mount passive components directly over embedded active components and to use these and other stack components as heat sinks or other cooling components. Yet other benefits can be reduced package cost and improved reliability, due to more stable interconnects and couplings.

Embedded active inserts also provides the opportunity to test the circuitry of the insert before embedding, an option generally not available in conventional PCB structures where testing may be not be feasible until the entire PCB is assembled. Moreover, use of embedded inserts can be integrated within conventional PCB manufacturing methods, regardless of complexity level of the PCB manufacturing itself or the processing technology used. Die insertion and handling challenges also can be avoided.

Figure 8:
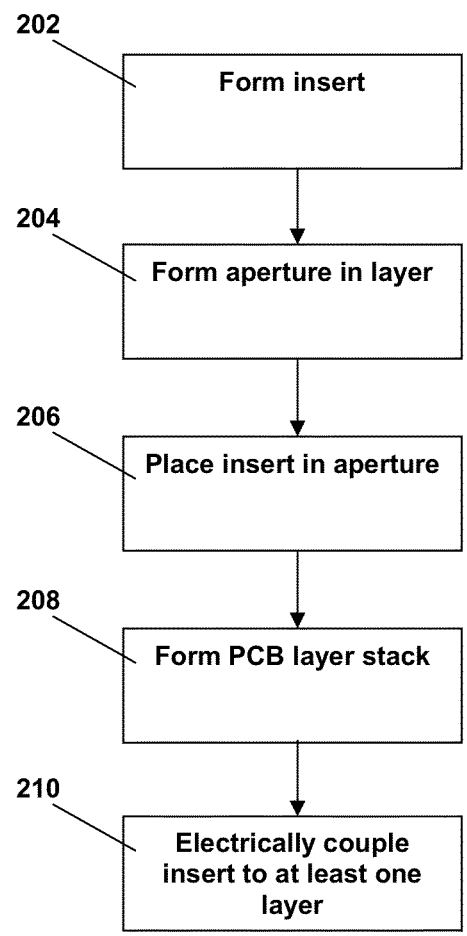
FIG. 8 is a flowchart of a process according to an embodiment.

Referring then to FIG. 8, a basic process flow includes forming an insert at 202, and forming at least one PCB layer with an aperture or well configured to receive the insert at 204. At 206, the insert is arranged in the aperture, and the remaining PCB stack is formed at 208. As part of 208 or at 210, vias or other electrical coupling structures can be formed in order to couple one or more elements or nodes of the insert with one more layers or components of the PCB stack. In one embodiment, plated through-hole vias are formed in the stack to mechanically and electrically couple coupling elements of the insert with one or more layers of the PCB. The particular steps, processes and technologies used to form the stack at 208 and electrical couplings at 210, as well as the structure of the insert and/or layer(s) in which the insert is arranged, can vary, as discussed herein. Additional steps also can be incorporated, such as optional testing of the insert itself before 206 or 208, testing of the PCB stack itself after 208 or 210, and other processes and steps as appreciated by those having skill in the art. Furthermore, while embodiments depicted herein generally comprise a single insert in any one PCB stack, other embodiments can comprise a plurality of inserts, with the plurality of inserts arranged in the same layer or in different layers.

Given the flexibility and advantages presented by embodiments of embedded active inserts in PCB structures, there are myriad applications. These applications can include but are not limited to computing applications, such as synchronous buck converters; solar inverter applications; automotive applications, including power converters; and many others, such as one or more integrated circuits or circuit elements generally comprising power ICs, control ICs, memory ICs, inverter ICs and/or others. For example, another computing application can be a personal computer (PC) motherboard, in which the memory, power and processor are arranged on different layers of an insert, or with one or more of these components being otherwise arranged on the PCB with some embedded within. In essence, virtually any PCB application can be suitable for one or more embodiments of embedding active inserts therein.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An insert configured to be embedded in a multi-layer printed circuit board (PCB) that comprises a first layer, a second layer that includes an aperture, and at least a third layer arranged above the second layer, the insert comprising:
    a first planar surface of the insert;
    a second planar surface of the insert opposed to the first planar surface of the insert;
    a semiconductor die interposed between the first planar surface of the insert and the second planar surface of the insert, wherein the semiconductor die comprises:
        a first planar surface of the semiconductor die;
        a second planar surface of the semiconductor die opposed to the first planar surface of the semiconductor die;
        a first pad on the first planar surface of the semiconductor die configured to be electrically coupled with an exposed portion of the first planar surface of the insert to create an electrical connection to at least one circuit of the semiconductor die from an outer portion of the first planar surface of the insert;
        a second pad on the second planar surface of the semiconductor die configured to be electrically coupled with an exposed portion of the second planar surface of the insert to create an electrical connection to at least one circuit of the semiconductor die from an outer portion of the second planar surface of the insert;
    at least one power transistor comprising a source, a gate, and a drain;
    wherein at least one of the source and the gate is electrically coupled to the first pad, and
    wherein the drain is electrically coupled to the second pad.

2. The insert of claim 1, further comprising a first extender portion that extends from the first pad along a first distance on the first planar surface of the insert to a first coupling element and a second extender portion that extends from the second pad along a second distance on the second planar surface to a second coupling element, wherein each of the first coupling element and the second coupling element has a surface area substantially greater than a surface area of either the first pad and the second pad of the semiconductor die, and wherein the first coupling element and the second coupling element are configured to be electrically coupled from external to the second layer through an opening in one or more of the first layer and the third layer.

3. The insert of claim 2, wherein the surface area of each of the first coupling element and the second coupling element of the insert is at least ten times greater than the surface area of the first pad and the second pad of the semiconductor die.

4. The insert of claim 2, wherein the opening formed in one or more of the first layer and the third layer is formed using mechanical boring.

5. The insert of claim 4, wherein the distance that each of the first extender portion and second extender portion extends from the semiconductor die to the respective first coupling element and second coupling element is selected such that the die is not damaged as a result of forming the opening using the mechanical boring.

6. The PCB of claim 1, wherein the insert comprises a plurality of layers.

7. The PCB of claim 6, wherein the insert comprises a different number of layers than the at least one layer of the plurality of layers comprising the aperture.

8. The insert of claim 1, wherein the insert further comprises a plurality of PCB layers, wherein the semiconductor die is embedded within the plurality of PCB layers.

9. A printed circuit board (PCB) comprising:
a first layer;
a second layer that includes an aperture, wherein the aperture is sized, shaped, and arranged to receive an insert that is configured to be disposed in the aperture in the second layer, wherein the insert comprises:
a first planar surface of the insert;
a second planar surface of the insert opposed to the first planar surface of the insert;
a semiconductor die interposed between the first planar surface of the insert and the second planar surface of the insert, wherein the semiconductor die comprises:
a first planar surface of the semiconductor die;
a second planar surface of the semiconductor die opposed to the first planar surface of the semiconductor die;
a first pad on the first planar surface of the semiconductor die configured to be electrically coupled with an exposed portion of the first planar surface of the insert to create an electrical connection to at least one circuit of the semiconductor die from an outer portion of the first planar surface of the insert;
a second pad on the second planar surface of the semiconductor die configured to be electrically coupled with an exposed portion of the second planar surface of the insert to create an electrical connection to at least one circuit of the semiconductor die from an outer portion of the second planar surface of the insert;
at least one power transistor comprising a source, a gate, and a drain;
wherein at least one of the source and the gate is electrically coupled to the first pad; and
wherein the drain is electrically coupled to the second pad; and
at least one third layer arranged upon the second layer to substantially enclose the semiconductor die within the aperture.

10. The PCB of claim 9, wherein the insert further comprises a first extender portion that extends from the first pad along a first distance on the first planar surface of the insert to a first coupling element and a second extender portion that extends from the second pad along a second distance on the second planar surface to a second coupling element, wherein each of the first coupling element and the second coupling element has a surface area substantially greater than a surface area of either the first pad and the second pad of the semiconductor die; and wherein the first coupling element and the second coupling element are configured to be electrically coupled from external to the second layer through an opening formed in one or more of the first layer and the third layer.

11. The PCB of claim 10, wherein the surface area of each of the first coupling element and the second coupling element of the insert is at least ten times greater than the surface area of the first pad and the second pad of the semiconductor die.

12. The PCB of claim 10, wherein the opening formed in one or more of the first layer and the third layer is formed using mechanical boring.

13. The PCB of claim 12, wherein the distance that each of the first extender portion and second extender portion extends from the semiconductor die to the respective first coupling element and second coupling element is selected such that the die is not damaged as a result of forming the opening using the mechanical boring.

14. The PCB of claim 9, wherein the insert further comprises a plurality of PCB layers, wherein the semiconductor die is embedded within the plurality of PCB layers.

15. A printed circuit board (PCB) comprising:
a plurality of layers coupled to form a stack, wherein at least one layer of the plurality of layers comprises an aperture;
an insert configured to be disposed in the aperture, wherein the insert comprises:
a first planar surface of the insert;
a second planar surface of the insert opposed to the first planar surface of the insert;
a die interposed between the first planar surface of the insert and the second planar surface of the insert; and
at least one coupling element spaced apart from the die;
wherein the die comprises:
a first planar surface of the die;
a second planar surface of the die opposed to the first planar surface of the die;
a first pad on the first planar surface of the die configured to be electrically coupled with an exposed portion of the first planar surface of the insert to create an electrical connection to at least one circuit of the die from an outer portion of the first planar surface of the insert;
a second pad on the second planar surface of the die configured to be electrically coupled with an exposed portion of the second planar surface of the insert to create an electrical connection to at least one circuit of the die from an outer portion of the second planar surface of the insert;
at least one power transistor comprising a source, a gate, and a drain;
wherein at least one of the source and the gate is electrically coupled to the first pad; and
wherein the drain is electrically coupled to the second pad.

16. The PCB of claim 15, wherein the die comprises an active element.

17. The PCB of claim 16, wherein the active element comprises an integrated circuit (IC) device.

18. The PCB of claim 17, wherein the IC device comprises at least one of a power IC, a control IC, a memory IC or an inverter IC.

19. The PCB of claim 15, wherein at least one of the plurality of layers comprises pre-preg.

20. The PCB of claim 15, wherein at least one of the plurality of layers comprises a dual-sided core.

21. The PCB of claim 15, wherein the insert further comprises:
- at least one alignment portion configured to interface with a corresponding alignment portion of the aperture of the at least one layer; and
- at least one via formed through the plurality of layers and the at least one coupling element to electrically couple the insert with at least one of the plurality of layers other than the at least one layer comprising the aperture.

22. The PCB of claim 21, wherein the at least one via comprises a plated through-hole via.

23. The PCB of claim 21, wherein the at least one via is formed through the plurality of layers and the at least one coupling element to electrically couple the insert with at least one of the plurality of layers other than the at least one layer comprising the aperture and with the layer comprising the aperture.

24. The PCB of claim 15, wherein the insert further comprises a plurality of PCB layers, wherein the semiconductor die is embedded within the plurality of PCB layers.

25. A method of forming a printed circuit board (PCB) stack comprising:
- forming an insert comprising:
  - a first planar surface of the insert;
  - a second planar surface of the insert opposed to the first planar surface of the insert;
  - a semiconductor die interposed between the first planar surface of the insert and the second planar surface of the insert, wherein the semiconductor die comprises:
    - a first planar surface of the semiconductor die;
    - a second planar surface of the semiconductor die opposed to the first planar surface of the semiconductor die;
    - a first pad on the first planar surface of the semiconductor die configured to be electrically coupled with an exposed portion of the first planar surface of the insert to create an electrical connection to at least one circuit of the semiconductor die from an outer portion of the first planar surface of the insert;
    - a second pad on the second planar surface of the semiconductor die configured to be electrically coupled with an exposed portion of the second planar surface of the insert to create an electrical connection to at least one circuit of the semiconductor die from an outer portion of the second planar surface of the insert;
  - at least one power transistor comprising a source, a gate, and a drain;
    - wherein at least one of the source and the gate is electrically coupled to the first pad, and
    - wherein the drain is electrically coupled to the second pad; and
  - a first extender portion that extends from the first pad along a first distance on the first planar surface of the insert to a first coupling element and a second extender portion that extends from the second pad along a second distance on the second planar surface to a second coupling element, wherein each of the first coupling element and the second coupling element has a surface area substantially greater than a surface area of either the first pad and the second pad of the semiconductor die;
- forming a first layer comprising an aperture;
- arranging the insert in the aperture;
- arranging at least one additional layer with the first layer to form a stack; and
- electrically coupling with the first coupling element of the insert from external to the first layer through an opening in the first layer;
- electrically coupling with the second coupling element of the insert from external to the first layer of the stack through an opening in one or more additional layers of the PCB stack.

26. The method of claim 25, wherein the first layer comprises a plurality of layers.

27. The method of claim 26, wherein the die comprises an integrated circuit (IC).

28. The method of claim 26, wherein arranging at least one additional layer adjacent the first layer comprises laminating the at least one additional layer to the first layer.

29. The method of claim 25, further comprising forming the opening by mechanical boring.

30. The method of claim 29, wherein the distance that each of the first extender portion and second extender portion extends from the semiconductor die to the respective first coupling element and second coupling element is selected such that the die is not damaged as a result of forming the opening using the mechanical boring.

* * * * *